United States Patent [19]
Kardash

[11] Patent Number: 6,137,329
[45] Date of Patent: Oct. 24, 2000

[54] LOAD VOLTAGE SLEW-RATE CONTROLLER

[75] Inventor: John J. Kardash, Gilroy, Calif.

[73] Assignee: Quantum Corporation, Milpitas, Calif.

[21] Appl. No.: 09/014,073

[22] Filed: Jan. 27, 1998

[51] Int. Cl.$^7$ .................................................. H03K 5/12
[52] U.S. Cl. ........................................... 327/170; 327/110
[58] Field of Search ..................................... 327/108, 110, 327/170, 312, 332, 389, 391, 392, 399, 427, 431–435, 437; 323/315

[56] References Cited

U.S. PATENT DOCUMENTS

| | | | |
|---|---|---|---|
| 5,157,351 | 10/1992 | Carbolante | 330/277 |
| 5,191,269 | 3/1993 | Carbolante | 318/254 |
| 5,194,760 | 3/1993 | Braun et al. | 307/263 |
| 5,397,967 | 3/1995 | Carobolante et al. | 318/254 |
| 5,469,094 | 11/1995 | Nessi | 327/110 |
| 5,561,391 | 10/1996 | Wellnitz et al. | 327/309 |
| 5,576,648 | 11/1996 | Rossi et al. | 327/110 |
| 5,675,297 | 10/1997 | Gose et al. | 332/109 |
| 5,694,282 | 12/1997 | Yockey | 361/86 |

*Primary Examiner*—My-Trang Nuton
*Attorney, Agent, or Firm*—Michael Zarrabian

[57] ABSTRACT

A controller for controlling the voltage slew-rate of an inductive load connected to the drain of a field effect transistor is disclosed. The controller includes a current generator electrically connected between the gate and the drain of the field effect transistor, the current generator providing a current at the gate of the field effect transistor to offset a feed back current at the gate of the transistor due to gate-drain capacitance of the transistor. The current generator includes capacitor means having one end electrically connected to the drain of the field effect transistor, a current multiplier electrically connected between another end of the capacitor means and the gate of the field effect transistor, and a current source electrically connected to the gate of the field effect transistor. The current multiplier includes at least one current mirror, and the current source includes a constant current source.

24 Claims, 5 Drawing Sheets

LOAD VOLTAGE SLEW-RATE CONTROLLER

FIELD OF THE INVENTION

The present invention relates to load voltage slew-rate controllers, and to a load voltage slew-rate controller for spindle motor winding loads on the drain of a field effect transistor.

BACKGROUND

Disk drives are utilized in many information and processing systems for storing data. A typical disk drive includes a spindle motor for rotating a data disk. The spindle motor can be a brush less DC motor having multiple phase windings arranged as a stator, and a rotor having a permanent magnet for rotating the disk. The motor is commutated to start from standstill and maintain an operational speed by sequentially energizing appropriate phase windings based on the location of the rotor to the phase windings. The energized windings generate torque inducing magnetic fields relative to the rotor magnet that rotate the rotor.

One method of energizing the windings is via Pulse Width Modulation (PWM) to conserve power. In PWM, a train of pulses are applied to energize the windings, whereby power to each winding is switched on and off. Since each winding is an inductive load, a change in current flowing through the inductive load during switching causes the voltage across the load to rise or fall as a ramp. The power dissipated by the load during switching is a function of the duration and amount of current flowing through the load during switching. Therefore, controlling the slew-rate of the ramp voltage across the inductive load can reduce power dissipation by the inductive load in PWM. Load voltage slew-rate control also helps reduce electromagnetic disturbance and coupling to other circuits. Further, slew-rate control reduces acoustic noise generated by the inductive loads, when switching the loads on and off, by smoothing out any spikes in the ramp voltage across the load.

Existing slew-rate controllers typically include a field effect transistor electrically connected to an inductive load at the drain of the transistor to control the rate of change of voltage across the load at turn off. The gate-drain capacitance of field effect transistors causes a feed back current to the gate of the transistor (Miller effect) leading to instability and oscillation. To alleviate this problem, conventional controllers utilize a capacitor with one end connected to the drain of the field effect transistor and another end connected to the input of a voltage amplifier, and the output of the amplifier is connected to the gate of the transistor. A change in the load voltage at the drain of the field effect transistor causes a current to flow through the capacitor and change the voltage at the input of the amplifier. The voltage amplifier amplifies the input voltage and applies an amplified voltage change to the gate of the transistor, thereby controlling the load voltage slew-rate at the drain.

One disadvantage of such controllers is that to handle large load voltage ramp slopes, the capacitor must have high capacity. High capacitance requires calls for sizeable capacitors, occupying precious physical space in integrated circuits. And, embedding large capacitors in such circuits is expensive. Another disadvantage of such controllers is that the voltage amplifier has a high voltage gain and can over-correct the voltage at the gate of the field effect transistor. A minor change in the voltage at the input of the amplifier causes a major change in the voltage at the gate of the field effect transistor, leading to ringing and control instability at the drain of the transistor. To compensate for the instability, a larger capacitor must be used, occupying even more precious space. Yet another disadvantage of such controllers is that the high impedance at the input of the voltage amplifier causes noise as the voltage amplifier switches operating modes in response to voltage changes at its input.

There is, therefore, a need for a voltage slew-rate controller with reduced circuit dimensions which provides substantially stable slew-rate control with reduced noise and ringing.

SUMMARY

The present invention satisfies these needs. In one embodiment, the present invention provides a controller for controlling the voltage slew-rate of an inductive load connected to a field effect transistor having a gate, a source and a drain, with the drain electrically connected to the load. The controller comprises a current generator electrically connected between the gate and the drain of the field effect transistor to provide a current at the gate of the field effect transistor to offset a feed back current at the gate of the transistor due to gate-drain capacitance of the transistor.

The current generator comprises capacitor means with one end electrically connected to the drain of the field effect transistor, a current multiplier electrically connected between another end of the capacitor means and the gate of the field effect transistor, and a current source electrically connected to the gate of the field effect transistor. The current multiplier comprises at least one current mirror, and the current source comprises a constant current source.

In another aspect, the present invention provides a controller for driving an inductive load, comprising a field effect transistor having a gate, a source and a drain, with the drain electrically connected to the inductive load, and a current generator, described above, electrically connected between the gate and the drain of the field effect transistor to control a voltage slew-rate to the inductive load.

Yet in another aspect, the present invention provides a controller for controlling the voltage slew-rate of an inductive load connected to a field effect transistor having a gate, a source and a drain, with the drain electrically connected to the load. The controller comprises a first current generator electrically connected between the gate and the drain of the field effect transistor to provide a current at the gate of the field effect transistor to offset a feed back current at the gate of the transistor due to gate-drain capacitance of the transistor when the load is switching off; and a second current generator electrically connected between the gate and the drain of the field effect transistor to provide a current at the gate of the field effect transistor to offset a feed back current at the gate of the transistor due to gate-drain capacitance of the transistor when the load is switching on.

BRIEF DESCRIPTION OF THE DRAWINGS

These and other features, aspects and advantages of the present invention will become better understood with regard to the following description, appended claims and accompanying drawings where:

DESCRIPTION

Figure 1:
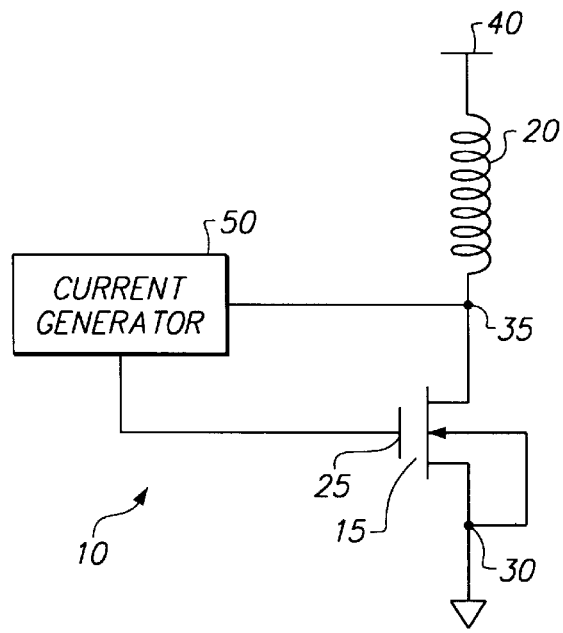
FIG. 1 is a block diagram of an embodiment of a load voltage slew-rate controller according to the present invention interconnected to a field effect transistor and an inductive load.

FIG. 1 shows a block diagram of a load voltage slew-rate controller 10 according to the present invention, interconnected to a field effect transistor 15 and an inductive load 20. The transistor 15 has a gate 25, a source 30, and a drain 35, the drain 35 being electrically connected to the inductive load 20. The inductive load 20 is connected in circuit between a voltage source 40 and the drain 35 of the transistor 15. The controller 10 comprises a current generator 50 electrically connected between the gate 25 and the drain 35 of the transistor 15 to provide a current at the gate 25 of the transistor 15 to offset a feed back current at the gate 25 of the transistor 15 due to gate-drain capacitance of the transistor 15. As such, the controller 10 limits the voltage slew-rate on the inductive load 20 to reduce noise and other electromagnetic disturbances, particularly at turn off.

Figure 2:
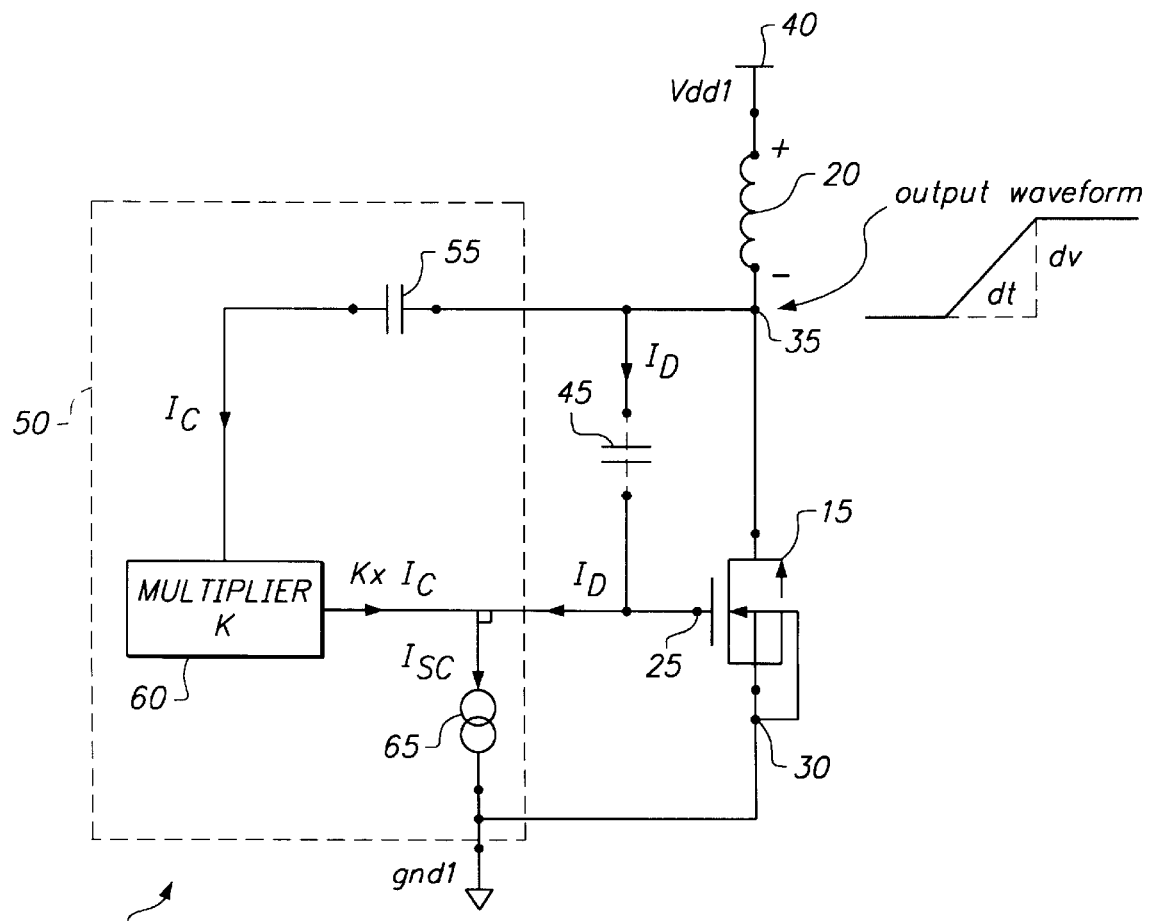
FIG. 2 is a schematic diagram of the controller of FIG. 1, with an equivalent circuit of the field effect transistor.

FIG. 2 shows a schematic diagram of an embodiment of the controller 10 with an equivalent circuit of the field effect transistor 15. A capacitor 45 represents the internal gate-drain capacitance $C_D$ of the transistor 15. The current generator 50 comprises capacitor means such as a capacitor 55 having one end electrically connected to the drain 35 of the transistor 15, a current multiplier 60 electrically connected between another end of the capacitor 55 and the gate 25 of the transistor 15, and a current source 65 electrically connected to the gate 25 of the transistor 15.

The capacitor 55 has a capacitance $C_C$, the current source 65 sinks or sources a current $I_{SC}$, and the current multiplier 60 has a current magnification factor of K. During power turn off on the load 20, a change in output voltage at the drain 35 of the transistor 15, causes a current $I_C$ to flow through the capacitor 55, where $I_C = C_C \times dv/dt$ and dv is the voltage change across the capacitor 55 in time dt. The current $I_C$ flows through the current multiplier 60, whereupon it is magnified to a current product $K \times I_C$. The output voltage change at the drain 35 of the transistor 15 also causes a current $I_D$ to flow through the capacitor 45, where $I_D = C_D \times dv/dt$ and dv is the voltage change across the capacitor 45 in time dt. The current $I_D$ is the difference between the current product $K \times I_C$ and the current $I_{SC}$ flowing through the current source 65, where $I_D = I_{SC} - K \times I_C = C_D \times dv/dt$. Replacing $I_C$ with the product $C_C \times dv/dt$, provides: $I_{SC} - K \times (C_C \times dv/dt) = C_D \times dv/dt$, from which:

$$dv/dt = I_{SC}/(C_D + K \times C_C) \qquad \text{Relation 1}$$

From Relation 1, the rate of change of voltage at the drain 35 of the transistor 15 is related to the current $I_{SC}$ divided by the sum of the gate-drain capacitance $C_D$ and the capacitance product $K \times C_C$. The capacitance product $K \times C_C$ provides a well-defined capacitance which masks the effect of the gate-drain capacitance $C_D$. This is advantageous, because as described above, the gate-drain capacitance $C_D$ can cause wide tolerances on the voltage slew-rate at the drain 35 of the transistor 15. Since $C_D$ is variable, $C_C$ is made the dominant discharge capacitor through the magnification factor K of the current multiplier 60.

Further, since the magnification factor K can be selected to be large, advantageously, the capacitor 55 can be selected to be small, thereby occupying less circuit space. In most spindle drivers, there are typically six slew-rate control circuits, and a small capacitor 55 provided by the present invention represents considerable size savings in circuit space. For example, by selecting a magnification factor K=10, the current multiplier 60 increases an $I_C$ of about $2\,\mu\text{A}$ to a current product $K \times I_C$ of about $20\,\mu\text{A}$, thereby effectively magnifying the capacitance $C_C$ to the capacitance product $10 \times C_C$. As such capacitor 55 can be ten times smaller than required in conventional systems.

The controller 10 of the present invention also provides stable load voltage slew-rate control, because during switching of power to the load 20, the voltage at the gate 25 of transistor 15 remains substantially constant as a discharge current is sunk through the current source 65. A voltage ramp at the drain 35 of the transistor 15 causes the current $I_C$ to flow through the capacitor 55 and the current $I_D$ to flow through the capacitor 45. Since the current $I_C$ is magnified by the current multiplier 60 to the current product $K \times I_C$, the current $I_{SC}$ flowing through the current source 65 is dominated by the current product $K \times I_C$, minimizing the local feed back current $I_D$ flowing through the capacitor 45.

The current source 65 and the current multiplier 60 are selected to limit the amount of current flowing through capacitors 45 and 55, such that a current difference $I_{SC-K \times IC}$ is sufficient to maintain the gate 25 of the transistor 15 at a substantially constant voltage. This stability of voltage at the gate 25 of the transistor 15 provides stable load voltage slew-rate control at the drain 35 of the transistor 15.

The controller 10 of the present invention utilizes the current source 65 to offset the current $I_D$, rather than a voltage source used in conventional systems. Using the current source 65 according to the present invention is advantageous since the current source 65 provides a smoother transfer of charge to the gate-drain capacitor 45, reducing noise and electromagnetic disturbances. Noise is further reduced by the controller 10 of the present invention in the way the controller 10 switches from normal operation, where no discharge current flows through the current source 65, to a discharge operation, where discharge current flows through the current source 65. Switch over between said two modes of operation takes place at the gate 25 of the transistor 15. Since the gate 25 is heavily loaded by the gate-drain capacitance $C_D$ and by a gate-source capacitance of the transistor 15, switching transient signals are buffered, further reducing noise.

Figure 3A:
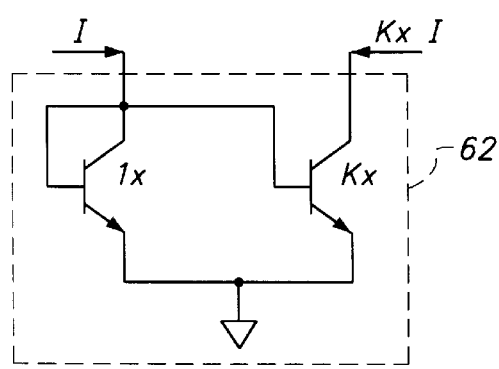
FIGS. 3a and 3b are schematic diagrams of NPN-type and PNP-type current mirror embodiments of the current multiplier of FIG. 2.
Figure 3B:
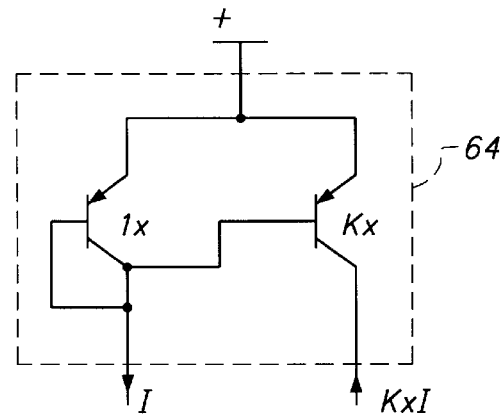

The current multiplier 60 can comprise one or more NPN-type or PNP-type current mirrors 62, 64 providing a magnification factor of K as shown in FIGS. 3a and 3b, respectively. Other current magnification means and circuits using NMOS and PMOS devices in place of bipolar devices are also contemplated by the present invention.

Figure 4:
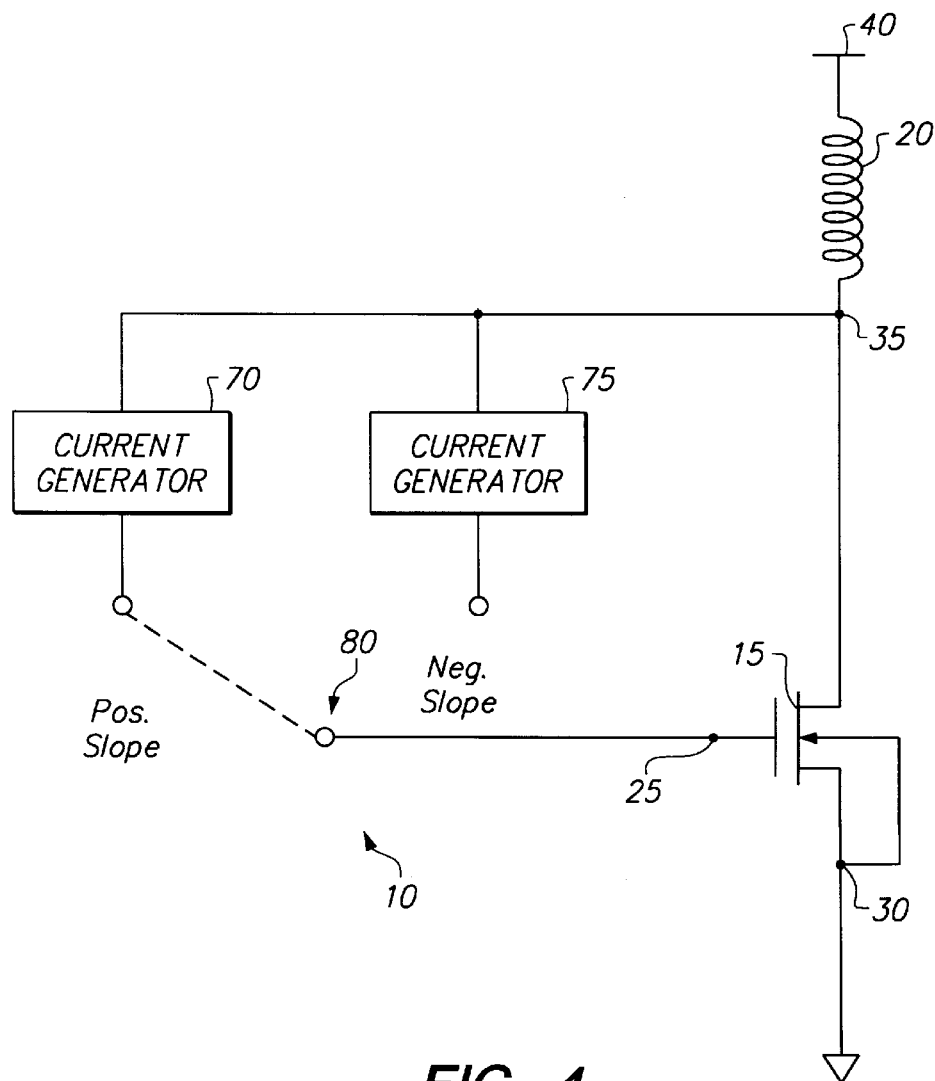
FIG. 4 is a schematic diagram of another embodiment of a load voltage slew-rate controller according to the present invention for voltage slew-rate control during switching an inductive load on and off.

Referring to FIG. 4, a schematic diagram of another embodiment of the controller 10 according to the present invention is shown. In this embodiment, the controller 10 provides voltage slew-rate control for switching the inductive load 20 on and off. This is particularly useful in PWM where slew-rate control on both edges of each pulse is desired. In this embodiment, controller 10 comprises two complementary current generators 70, 75 interconnected between the gate 25 and the drain 35 of the transistor 15 via a switch 80 as shown.

The switch 80 has two positions: (1) a positive slope control position (shown) wherein only the current generator 70 is electrically connected between the gate 25 and the drain 35 of the transistor 15 when the load 20 is turning off, and (2) a negative slope control position wherein only the current generator 75 is electrically connected between the gate 25 and the drain 35 of the transistor 15 when the inductive load 20 is turning on. The current generator 70 operates as described above, and the current generator 75 operates in a complementary fashion to current generator 70.

Figure 5:
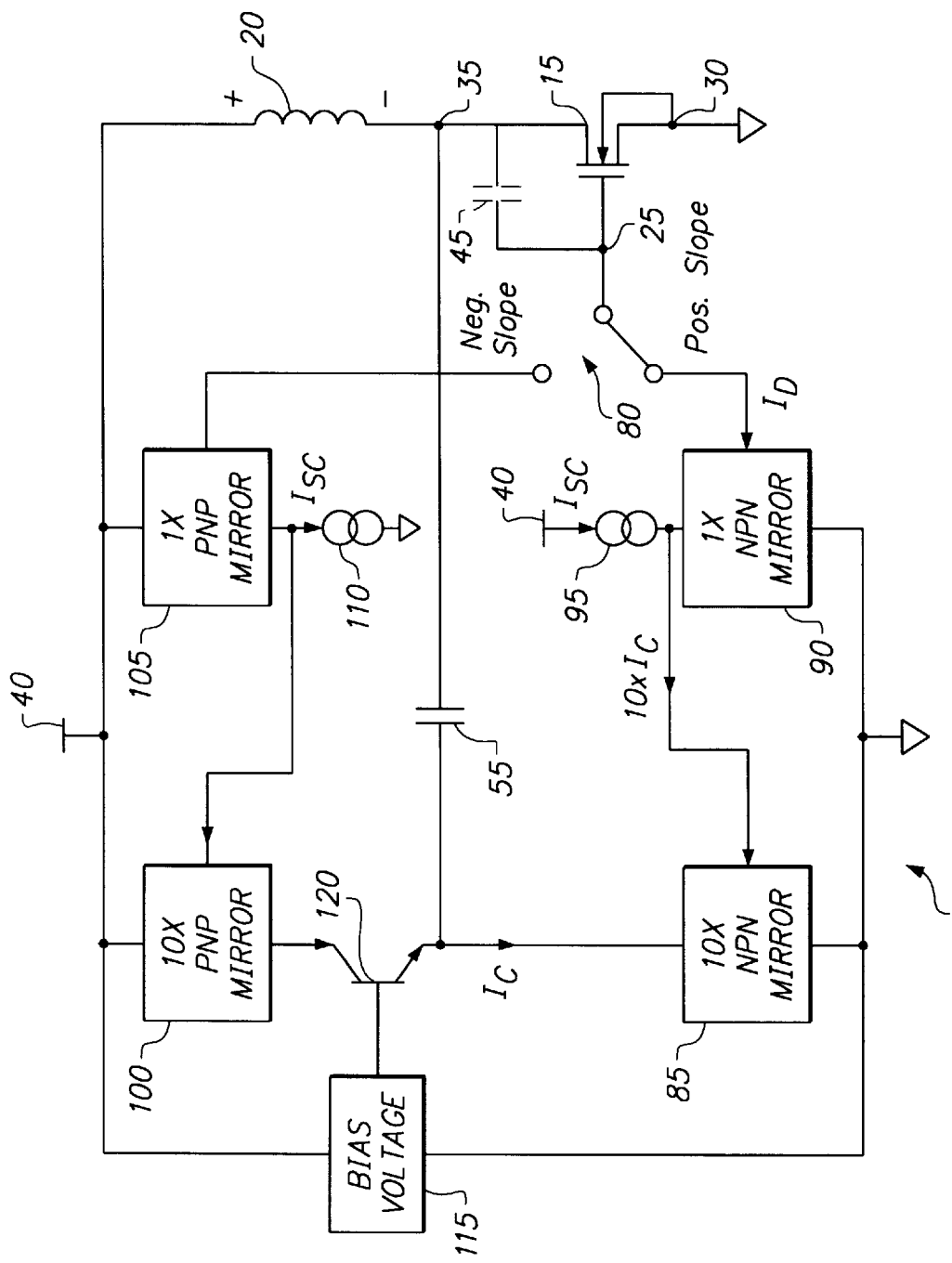
FIG. 5 is a schematic diagram of an example circuit for the controller of FIG. 4.

Referring to FIG. 5, a schematic diagram of an example circuit for the controller 10 of FIG. 4 is shown. The current generator 70 comprises an NPN-type current mirror 85 having a magnification factor of ten, an NPN-type current mirror 90 having a magnification factor of one, a current source 95, and the capacitor 55, interconnected as shown. The current generator 75 comprises a PNP-type current mirror 100 having a magnification factor of ten, a PNP-type current mirror 105 having a magnification factor of one, a current source 110, and the capacitor 55 interconnected as shown. The example controller 10 further includes a biasing voltage means 115 and a biasing transistor means 120 for biasing the current mirrors 85 and 100.

Figure 6:
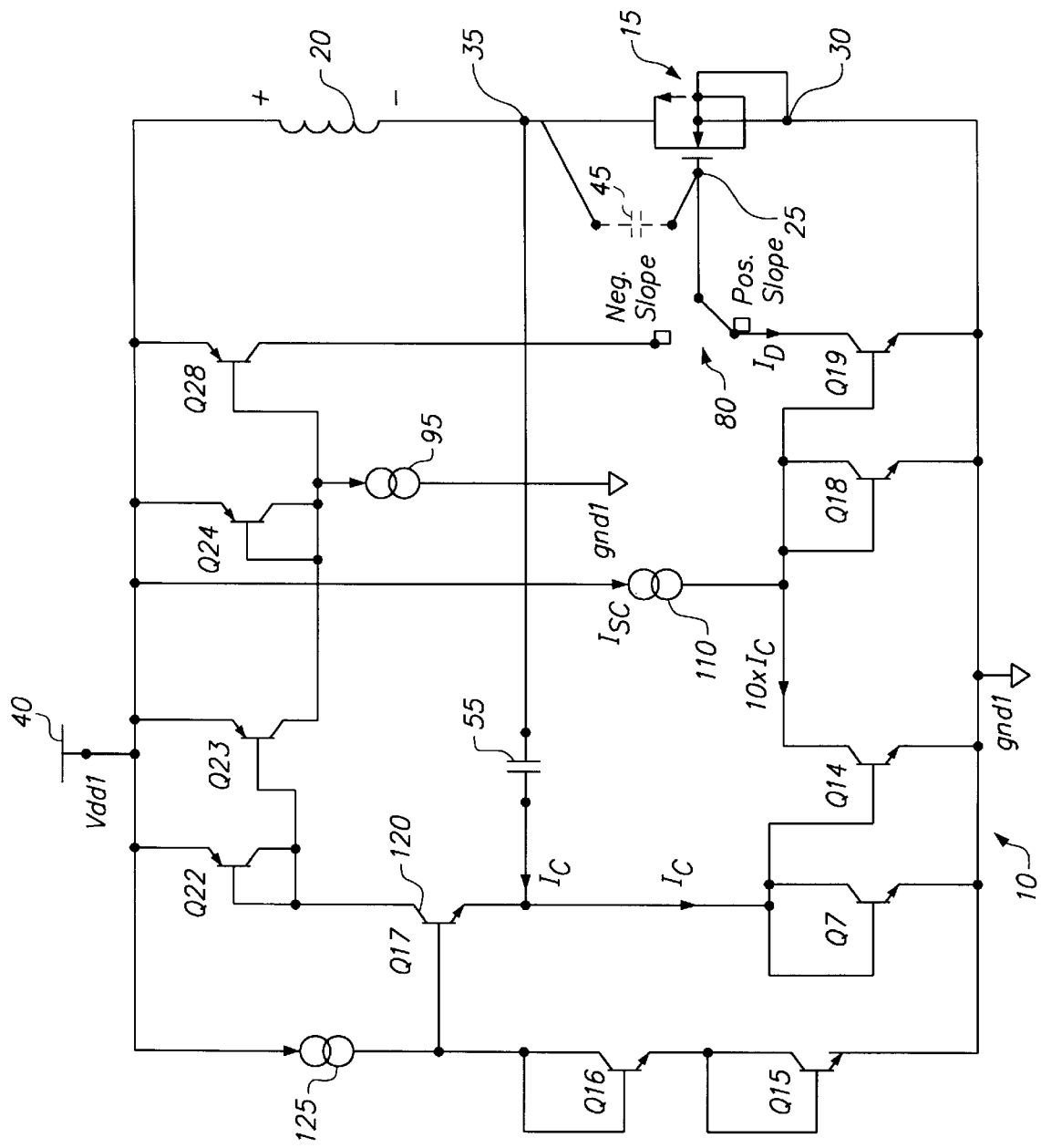
FIG. 6 is a detailed schematic diagram of an example equivalent circuit for the controller of FIG. 5.

FIG. 6 shows a detailed schematic diagram for an example equivalent circuit for the controller 10 of FIG. 5. Referring to FIGS. 5 and 6, the current mirror 85 includes NPN-type transistors Q14 and Q7 with respective relative geometries of ten to one, and the current mirror 90 includes NPN-type transistors Q18 and Q19 with respective relative emitter area ratios of one to one. Similarly, the current mirror 100 includes PNP-type transistors Q23 and Q22 with respective relative area ratios of ten to one, and the current mirror 105 includes PNP-type transistor Q24 and Q25 with respective relative area ratios of one to.

The voltage bias means 115 comprises a current source 125, and two diode transistors Q16 and Q15 with respective relative area ratios of five. The biasing transistor means 120 comprises a biasing transistor Q17 of relative area of one, interconnected as shown. Transistor Q17 is used to bias transistors Q7 and Q14 of the current mirror 85 to their active regions, and to provide a mirror current path to transistors Q22 and Q23 when the transistor 15 is switched in the negative direction. In the example controller circuit shown in FIG. 6, the current source 95 comprises a 50 $\mu$A constant current source, and the current source 110 comprises a 50 $\mu$A constant current source. The current source 125 comprises a constant current source of 5 $\mu$A.

Utilizing the controller 10 shown in FIG. 6, when the load 20 is turning off, the current $I_C$ flowing through the capacitor 55 is magnified to the current product 10x$I_C$, limiting the current $I_D$ flowing through the internal gate-drain capacitor 45 to the difference $I_{SC}$−10x$I_C$. The difference $I_{SC}$−10x$I_C$ is transferred to the collector of the transistor Q19, whereupon a current flowing through the collector of the transistor Q19 removes accumulated charge from the gate-drain capacitor 45 of the transistor 15. A change in voltage at the drain 35 of the transistor 15 is related to the current flowing through the capacitor 45 as dv/dt=($I_{SC}$−10x$I_C$)x$C_D$, where $I_C$=$C_C$x dv/dt. As such, dv/dt=($I_{SC}$−10x$C_C$x dv/dt)/$C_D$, or:

$$dv/dt = I_{SC}/(C_D + 10 \times C_C) \quad \text{Relation 2}$$

As an example, for a 1 amp driver transistor 15, typically the gate-drain capacitance $C_D$ is about 50 pf. Selecting $C_C$ to be about 5 pf, then for a low slew-rate (as in the case for slow commutation switching) dv/dt of 0.2 volts/$\mu$sec, Relation 2 provides $I_{SC}$ to be about 20 $\mu$A. For a high slew rate (as in the use of PWM) such as 20 volts/$\mu$sec, $I_{SC}$ would be about 2 mA.

The capacitance $C_C$ of the capacitor 55 can be from about 2 pf to about 25 pf. The capacitance of the other capacitor 45 can be from about 10 pf to about 2000 pf. The voltage source 40 can be from about 5V to about 20V. The field effect transistor 15 comprises an enhancement mode field effect transistor of about 100 $\mu$A to about 5 A, but can comprise DMOS devices or bipolar devices. The inductive load 20 typically comprises a spindle motor winding with an inductance of about 100 $\mu$H to about 10 MH, but can be other inductive loads.

In the embodiments of the controller 10 described above, the current sources 95 and 110 comprise constant current sources, each sourcing or sinking a currents from about 10 $\mu$A to about 20 mA. The current sources 95 and 110 can also comprise time dependent current sources.

Figure 7:
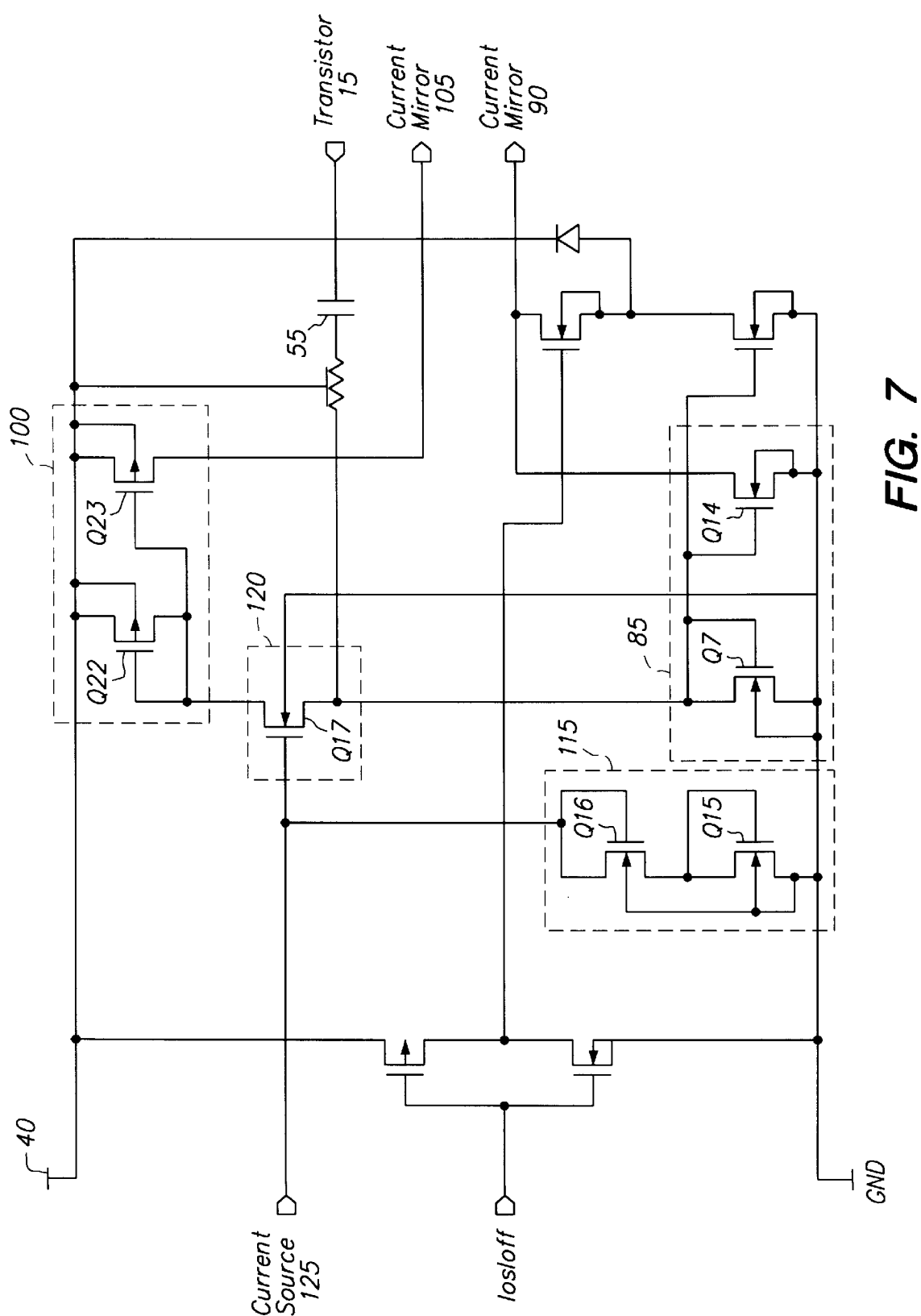
FIG. 7 is a schematic diagram of example MOS circuit geometry for the controller of FIG. 6.

Although bipolar devices have been shown in the embodiments of the controller 10 described herein, the controller 10 can also be implemented using MOS devices. FIG. 7 shows a partial schematic diagram of an exemplary MOS integrated circuit geometry of the current mirrors 100, 85, the biasing transistor means 120, the voltage bias means 115, and the capacitor 55 of the controller of FIGS. 5 and 6. The transistor 15, the switch 80, the load 20, and the current mirrors 105, 90, including the current sources 95, 100, are external to the diagram shown in FIG. 7. Exemplary component values for the controller 10 using the MOS circuit of FIG. 7 are equivalent to the values discussed above with respect to like components of FIGS. 5 and 6.

The circuit of FIG. 7 is illustrative of how the multiplying K factor can be made smaller or larger by enabling the control signal "losloff" to be on or off. This provides for controlling the K $C_C$ factor for high slew rates (PWM) or low slew rates (commutation switching). In the case of high slew rates, a lower K factor is used, which allows the $I_{SC}$ current to be lower than 2 mA, as described above with reference to the high slew rate case for FIG. 6. From a practical view, this allows the source current $I_{SC}$ to be a reasonable value for both high and low slew rate control. Additionally, this circuit can be used when the source of the transistor driver 15 is not tied to ground, but instead is used as a source follower, as in the case of high drivers in spindle applications. In this situation, the coupling capacitor 55 would be tied to the source rather than the drain.

Although the present invention has been described in considerable detail with regard to the preferred versions thereof, other versions are possible. Therefore, the appended claims should not be limited to the descriptions of the preferred versions contained herein.

I claim:

1. A controller for controlling the voltage slew-rate of an inductive load electrically connected to a field effect transistor having a control terminal, and an output terminal electrically connected to the load, the controller comprising:
   (a) a first current generator electrically connected between the control terminal and the output terminal of the field effect transistor, the first current generator providing a current at the control terminal of the field effect transistor to control the voltage slew-rate of the inductive load when the load is switching off; and
   (b) a second current generator electrically connected between the control terminal and the output terminal of the field effect transistor, the second current generator providing a current at the control terminal of the field effect transistor to control the voltage slew-rate of the inductive load when the load is switching on.

2. The controller of claim 1, wherein the first current generator comprises:
 (a) capacitor means having one end electrically connected to the output terminal of the field effect transistor;
 (b) a current multiplier electrically connected between another end of the capacitor means and the control terminal of the field effect transistor; and
 (c) a current source electrically connected to the current multiplier.

3. The controller of claim 2, wherein the current multiplier comprises at least one current mirror.

4. The controller of claim 3, wherein the current mirror includes NPN-type transistors.

5. The controller of claim 2, wherein the capacitor means comprises at least one capacitor having a capacity of at most about 25 pf.

6. The controller of claim 1, wherein the second current generator comprises:
 (a) capacitor means having one end electrically connected to the output terminal of the field effect transistor;
 (b) a current multiplier electrically connected between another end of the capacitor means and the control terminal of the field effect transistor; and
 (c) a current source electrically connected to the current multiplier.

7. The controller of claim 6, wherein the current multiplier comprises at least one current mirror.

8. The controller of claim 7, wherein the current mirror includes PNP-type transistors.

9. The controller of claim 6, wherein the capacitor means comprises at least one capacitor having a capacity of at most about 25 pf.

10. A controller for controlling the voltage slew-rate of an inductive load connected to a field effect transistor having a control terminal, and an output terminal electrically connected to the load, the controller comprising:
 capacitor means having one end electrically connected to the output terminal of the field effect transistor;
 a first current multiplier having one end electrically connected to another end of the capacitor means;
 switch means having a first switching position, a second switching position, and three ends, the first end of the switch means being electrically connected to another end of the first current multiplier, and the second end of the switch means being electrically connected to the control terminal of the field effect transistor;
 a second current multiplier having one end electrically connected to said other end of the capacitor means, and another end electrically connected to the third end of the switch means; and
 wherein in the first switch position the capacitor means and the first current multiplier are electrically connected in circuit between the output terminal and the control terminal of the field effect transistor, whereby the controller provides a first current at the control terminal of the field effect transistor to control the voltage slew-rate of the load when the load is switching off; and
 wherein in the second switch position the capacitor means and the second current multiplier are electrically connected in circuit between the output terminal and the control terminal of the field effect transistor, whereby the controller provides a second current at the control terminal of the field effect transistor to control the voltage slew-rate of the load when the load is switching on.

11. The controller of ciaim 10, wherein the first current multiplier comprises a first current mirror and a first current source electrically connected to the first current mirror.

12. The controller of claim 11, wherein the first current mirror includes NPN-type transistors.

13. The controller of claim 10, wherein the capacitor means comprises at least one capacitor having a capacity of at most about 25 pf.

14. The controller of claim 10, wherein the second current multiplier comprises a second current mirror and a second current source electrically connected to the second current mirror.

15. The controller of claim 14, wherein the second current mirror includes PNP-type transistors.

16. A controller for controlling the slew-rate of a voltage applied to an inductive load, comprising:
 (a) a current control means for controlling the level of current through the load, the current control means having a control terminal, and an output terminal electrically connected to the load;
 (b) current generator means for generating a current in response to changes in said load voltage, wherein the current generator means is electrically connected to the output terminal of the current control means;
 (c) a first current multiplier electrically connected between the control terminal of the current control means and the current generator means, for providing a current at the control terminal of the current control means to control a voltage slew-rate of the inductive load when the load is switching off; and
 (d) a second current multiplier electrically connected between the control terminal of the current control means and the current generator means, for providing a current at the control terminal of the current control means to control the voltage slew-rate of the inductive load when the load is switching on.

17. The controller of claim 16, wherein the current generator means comprises capacitor means.

18. The controller of claim 17, wherein the capacitor means comprises at least one capacitor having a capacity of at most about 25 pf.

19. The controller of claim 16, wherein the first current multiplier comprises at least one current mirror and a current source electrically connected to the current mirror.

20. The controller of claim 19, wherein the current source sources current.

21. The controller of claim 16, wherein the second current multiplier comprises at least one current mirror and a current source electrically connected to the current mirror.

22. The controller of claim 21, wherein the current source sinks current.

23. The controller of claim 16, wherein the current control means comprises a field effect transistor having said control terminal and said output terminal.

24. The controller of claim 23, wherein the field effect transistor comprises an enhancement mode field effect transistor.

* * * * *